United States Patent [19]

Nagata

[11] Patent Number: 4,985,688
[45] Date of Patent: Jan. 15, 1991

[54] MODULATION SYSTEM CAPABLE OF ACCURATELY COMPENSATING FOR NONLINEARITIES OF AN AMPLIFIER CONNECTED THERETO

[75] Inventor: Yoshinori Nagata, Tokyo, Japan
[73] Assignee: NEC Corporation, Tokyo, Japan
[21] Appl. No.: 459,387
[22] Filed: Jan. 5, 1990

[30] Foreign Application Priority Data
Jan. 6, 1989 [JP] Japan .................................. 1-1835

[51] Int. Cl.$^5$ .............................................. H03C 3/08
[52] U.S. Cl. ...................................... 332/123; 329/304
[58] Field of Search ...................... 332/123; 329/304; 375/39, 60, 61; 455/63, 110; 330/149

[56] References Cited
U.S. PATENT DOCUMENTS
4,700,151  10/1987  Nagata ............................. 332/123

Primary Examiner—Robert J. Pascal
Attorney, Agent, or Firm—Foley & Lardner, Schwartz, Jeffery, Schwaab, Mack, Blumenthal & Evans

[57] ABSTRACT

In a modualtion system responsive to a first sampled signal (31) of a first sampling rate for supplying a modulated analog signal to an amplifier having nonlinearities to make the amplifier produce an amplified output signal, a selector (72) selects the first sampled signal and a second sampled signal of a second sampling rate as a selected signal when supplied with first and second control signals, respectively. The second sampling rate is equal to 1/N (N: 2, 3, . . . ) of the first sampling rate. A processing arrangement (36) processes the selected signal with reference to a difference between the selected signal and an additional digital signal (35) to compensate for the nonlinearities to produce a processed signal. The processed signal is modulated into the modulated analog signal. The amplified output signal is demodulated and converted into the additional digital signal by a converter (40). A comparator (71) compares an absolute value of the difference with a threshold value and produces the first control signal when the absolute value is less than the threshold value. Otherwise, the second control signal is produced. A controller (78) may control a phase of a sampling signal supplied to the converter so that a quotient of the difference by a differential of the selected signal becomes equal to zero.

3 Claims, 6 Drawing Sheets

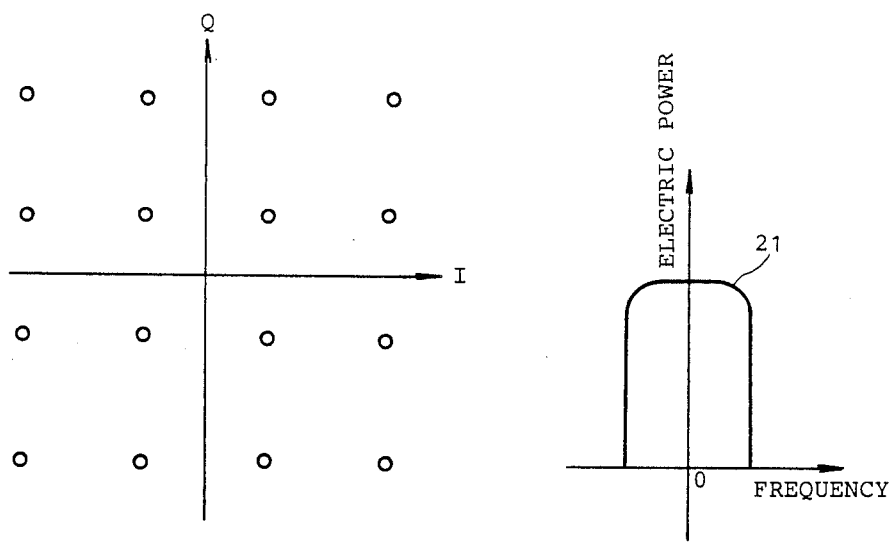
FIG. 1
FIG. 2
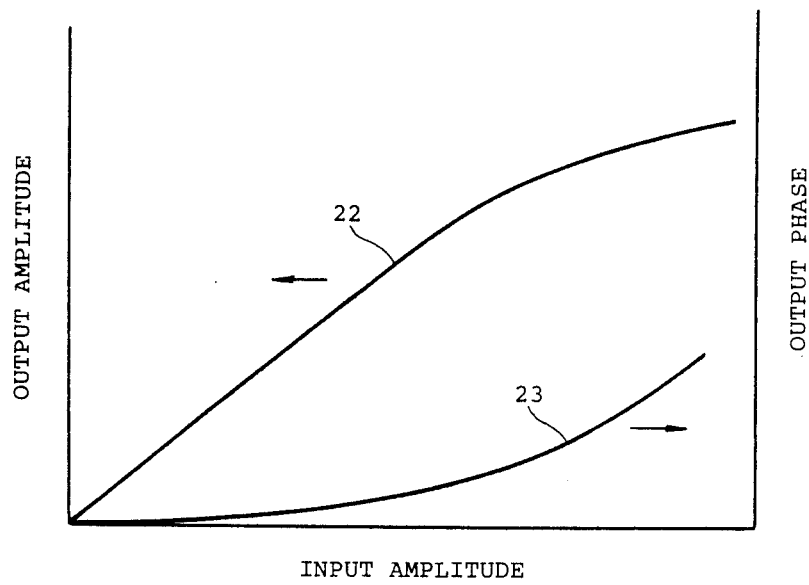
FIG. 3

MODULATION SYSTEM CAPABLE OF ACCURATELY COMPENSATING FOR NONLINEARITIES OF AN AMPLIFIER CONNECTED THERETO

BACKGROUND OF THE INVENTION

This invention relates to a modulation system for use in carrying out linear modulation in a radio communication system for digital signal transmission or analog signal transmission. It is to be noted throughout the instant specification that quadrature amplitude-phase modulation is exemplified as the linear modulation although this invention is not restricted to the quadrature amplitude-phase modulation.

Recently, deficiency or lack of a radio wave resource, namely, a radio frequency band has been pointed out and awakens a new interest in narrowing a radio frequency bandwidth for each radio channel so as to achieve effective use of the radio frequency band. In the light of narrowing the radio frequency bandwidth for each radio channel, linear modulation is superior to nonlinear modulation, such as frequency modulation, because the latter brings about inevitable expansion of the radio frequency bandwidth for each radio channel.

In general, a modulation system for such linear modulation is for use in combination with an amplifier, such as a solid state power amplifier or a traveling wave tube (TWT) amplifier, which inevitably has nonlinearities in phase and amplitude. The nonlinearities of the amplifier come from nonlinear AM/AM and AM/PM conversion characteristics and give rise to degradation of a transmission spectrum of a transmission signal produced by the amplifier and to deterioration of a reception characteristic of a receiver for receiving the transmission signal. In addition, the nonlinearities cause an intermodulation component to occur and bring about interference between adjacent ones of the radio channels.

As will later be described with reference to one of nine drawing figures of the accompanying drawing, a modulation system is disclosed in U.S. Pat. No. 4,700,151 issued to Yoshinori Nagata, the instant applicant and assigned to the present assignee. According to the Nagata patent, the modulation system is for supplying, in response to a sampled signal of a sampling rate, a modulated analog signal to an amplifier having nonlinearities to make the amplifier produce an amplified output signal. The modulation system includes a subtracter for producing a difference signal representative of a difference between the sampled signal and an additional digital signal. Connected to the subtractor, a processing arrangement processes the sampled signal with reference to the difference signal to compensate for the nonlinearities to produce a processed signal. Connected to the processing arrangement, a modulating arrangement modulates the processed signal into the modulated analog signal. A demodulator is connected to the amplifier to demodulate the amplified output signal into a demodulated signal. Connected to the demodulator, an analog-to-digital converter converts the demodulated signal into the additional digital signal at a specific rate which is equal to the sampling rate.

With this structure, a delay characteristic is inevitably varied in actual usage of the modulation system in a feedback portion which includes the modulating arrangement, the amplifier, the demodulator, and the analog-to-digital converter. For example, whenever an actual selected channel is changed from one of communication channels to another of the communication channels in a mobile telephone system, a delay time is varied.

When the delay characteristic is varied in actual usage, it is impossible to accurately compensate for the nonlinearities of the amplifier. This is because the subtractor can not be supplied with a correct signal as the additional digital signal from the analog-to-digital converter.

In order to compensate for such variation of the delay characteristic, another modulation system is disclosed by Y. Furuya in Japanese Unexamined Patent Prepublication (Kokai) No. Syô 63-208,330, namely, No. 208,330/1988. The modulation system comprises a variable delaying circuit for delaying the sampled signal by a variable delay which is varied in accordance with a delay control signal. The variable delaying circuit thereby produces a delayed signal. A differentiating circuit produces a differential signal representative of a differential of the delayed signal. A divider produces a quotient signal representative of a quotient of the difference signal by the differential signal. A low-pass filter filters the quotient signal into a filtered signal. Responsive to the filtered signal, a control signal producing circuit produces the delay control signal by which the variable delay is determined.

The modulation system can compensate for the variation of the delay characteristic. However, it is impossible to rapidly deal with the variation of the delay characteristic. This is because the differentiating circuit does not differentiate the sampled signal but differentiates the delayed signal which is delayed by the delaying circuit. That is, no consideration is paid to rapidly compensate for the nonlinearities in the modulation device.

SUMMARY OF THE INVENTION

It is therefore an object of this invention to provide a modulation system which is capable of accurately compensating for nonlinearities of an amplifier connected to the modulation system.

It is another object of this invention to provide a modulation system of the type described, which is capable of rapidly compensating for the nonlinearities.

Other objects of this invention will become clear as the description proceeds.

On describing the gist of this invention, it is possible to understand that a modulation system is for processing and modulating a first sampled signal of a first sampling rate to supply a modulated analog signal to an amplifier having nonlinearities to make the amplifier produce an amplified output signal, the modulation system including: substracting means for producing a difference signal representative of a difference between the first sampled signal and an additional digital signal; processing means connected to the substracting means for processing the first sampled signal with reference to the difference signal to compensate for the nonlinearities to produce a processed signal; modulating means connected to the processing means for modulating the processed signal into the modulated analog signal; demodulating means connected to the amplifier for demodulating the amplified output signal into a demodulated signal; and converting means connected to the demodulating means for converting the demodulated signal into the additional digital signal at a specific rate.

According to an aspect of this invention, the above-mentioned modulation system comprises: absolute value calculating means connected to the subtracting means for producing an absolute value of the difference signal; comparing means connected to the absolute value calculating means for comparing the absolute value with a preselected threshold value to produce a first control signal when the absolute value is less than the threshold value and to produce a second control signal when the absolute value is not less than the threshold value; and selecting means connected to the comparing means and the processing means and supplied with a second sampled signal of a second sampling rate for selecting the first and the second sampled signals as a selected signal to use the first and the second sampling rates as the specific rate when supplied with the first and the second control signals, respectively. The second sampling rate is equal to 1/N of the first sampling rate, where N represents an integer greater than one. The selected signal is substituted for the first sampled signal and processed and modulated into the modulated analog signal so long as the comparing means produces the second control signal.

It is additionally possible to understand that a modulation system is for processing and modulating a sampled signal of a sampling rate to supply a modulated analog signal to an amplifier having nonlinearities to make the amplifier produce an amplified output signal, the modulation system including: subtracting means for producing a difference signal representative of a difference between the sampled signal and an additional digital signal; processing means connected to the subtracting means for processing the sampled signal with reference to the difference signal to compensate for the nonlinearities to produce a processed signal; modulating means connected to the processing means for modulating the processed signal into the modulated analog signal; demodulating means connected to the amplifier for demodulating the amplified output signal into a demodulated signal; clock generating means for generating a sampling signal having a phase and a clock frequency determined by a specific rate which is equal to the sampling rate; and converting means connected to the demodulating means and the clock generating means for converting the demodulated signal into the additional digital signal at the specific rate.

According to another aspect of this invention, the additionally-understood modulation system comprises: differentiating means for producing a differential signal representative of a differential of the sampled signal; dividing means connected to the subtracting means and the differentiating means for producing a quotient signal representative of a quotient of the difference signal by the differential signal; and controlling means connected to the dividing means and the clock generating means for controlling the phase of the sampling signal so that the quotient becomes equal to zero.

BRIEF DESCRIPTION OF THE DRAWING

FIG. 1 is a view for use in describing a normal arrangement of signal points on a phase plane;

FIG. 2 is a graphical representation of a frequency characteristic resulting from the normal arrangement illustrated in FIG. 1;

FIG. 3 is a graphical representation for use in describing nonlinearities of an amplifier;

DESCRIPTION OF THE PREFERRED EMBODIMENT

Referring to FIGS. 1 through 5, description will at first be made as regards an influence of an amplifier having nonlinearities, such as a traveling wave tube amplifier, on a conventional modulation system which has no predistortion circuit and which carries out four-by-four quadrature-phase amplitude modulation, namely, 16-QAM.

As shown in FIG. 1, sixteen signal points are regularly placed on a phase plane defined by an in-phase axis I and a quadrature phase axis Q, if the amplifier had no nonlinearities. Specifically, the sixteen signal points are arranged on the phase plane in a rectangular shape and placed at normal or regular positions. The illustrated signal points may be referred to as normal signal points. In this event, a transmission spectrum has a distribution as shown in FIG. 2 by a curve 21 specified by a frequency versus electric power characteristic. The distribution of the transmission spectrum is sharply cut off when the spectrum is restricted by a Nyquist filter to a predetermined bandwidth, insofar as nonlinearities are absent in the amplifier.

In FIG. 3, the nonlinearities of the amplifier are shown by curves 22 and 23. The curve 22 represents an input amplitude versus output amplitude characteristic which may be referred to as an AM/AM conversion characteristic while the curve 23 represents an input amplitude versus output phase characteristic which may be referred to as an AM/PM conversion characteristic. Each of the curves 22 and 23 is linearly varied when the input amplitude is extremely smaller than a saturation point.

However, as the input amplitude approaches the saturation point, the output amplitude is saturated and the output phase is nonlinearly changed. This results in deterioration of the transmission spectrum and the reception characteristic.

Figure 4:
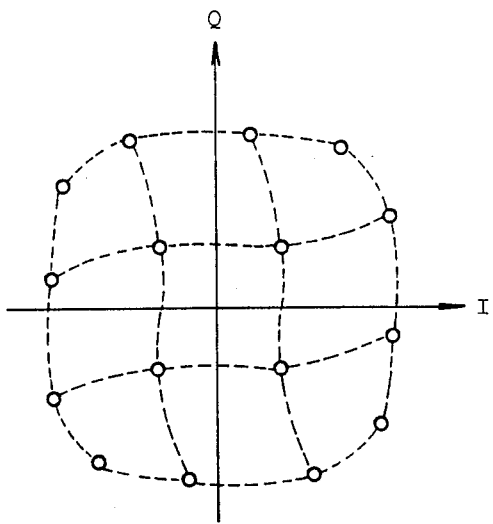
FIG. 4 is a view for use in describing a distorted arrangement of signal points which result on a phase plane when sampled signals are processed and modulated according to prior art.
Figure 5:
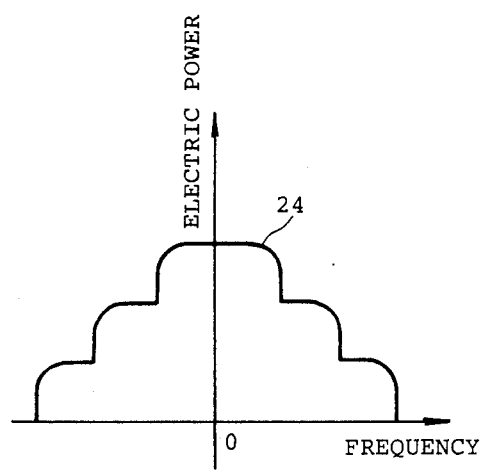
FIG. 5 is a graphical representation of a frequency characteristic resulting from the distorted arrangement illustrated in FIG. 4.

More particularly, the sixteen signal points on the phase plane are displaced in a manner as shown in FIG. 4 when an operating level of the amplifier is adjacent to the saturation point. Distribution or displacement of the signal points which is illustrated in FIG. 4 is deformed in comparison with normal distribution illustrated in FIG. 1. When the distribution of the signal points is deformed in the manner illustrated in FIG. 4, intermodulation components of odd number orders, such as a third-order and a fifth-order, inevitably appear due to the deformation of the distribution. Such intermodulation components give rise to an expansion of the transmission spectrum as shown by a curve 24 in FIG. 5 and introduce an interference into adjacent channel or channels.

Responsive to a transmission signal having the distribution of the signal points as illustrated in FIG. 4, a receiver carries out demodulation, on the assumption that the signal points are distributed on the phase plane in the manner illustrated in FIG. 1. Under the circumstances, errors might frequently occur in the receiver. Consequently, the reception characteristic is deteriorated in the receiver.

Figure 6:
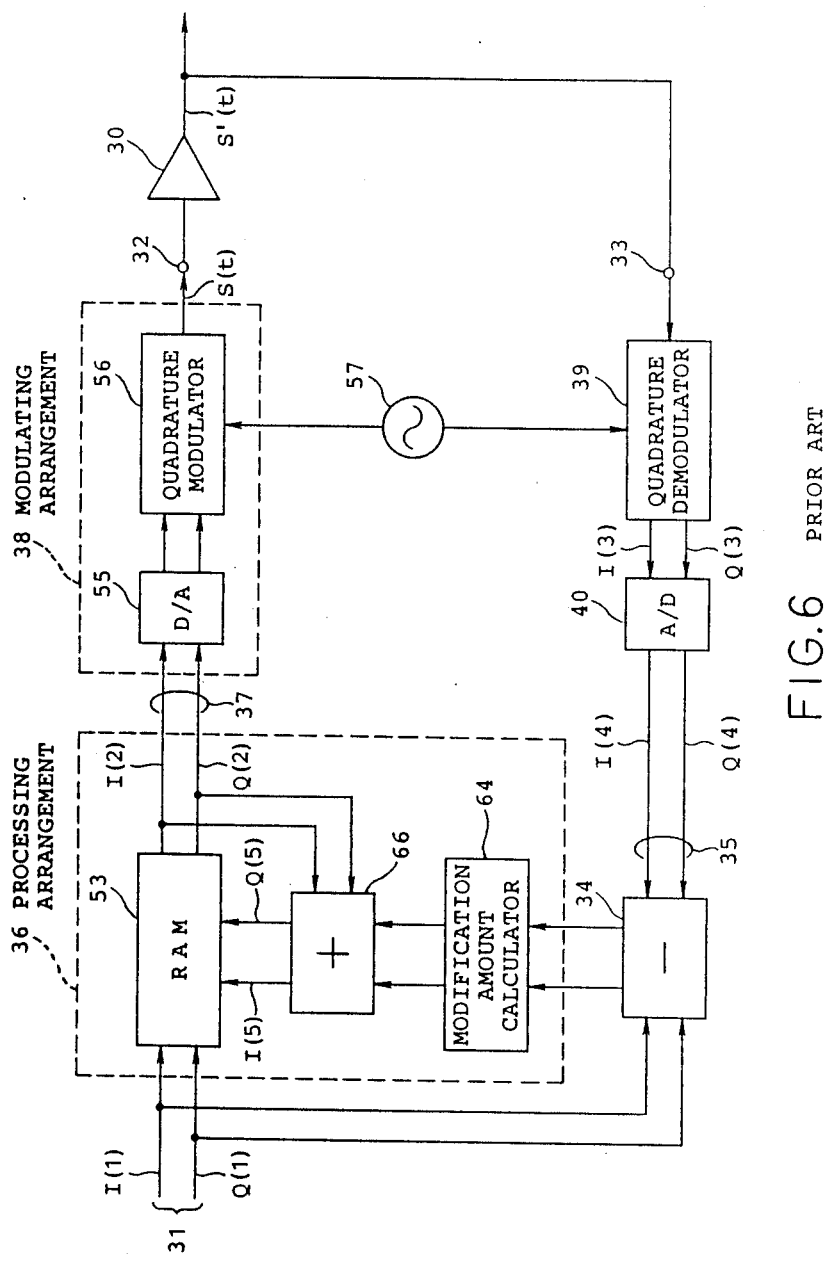
FIG. 6 is a block diagram of a conventional modulation system and an amplifier.

Referring to FIG. 6, a conventional modulation system is placed prior to an amplifier 30 having nonlinearities in phase and amplitude and supplies a modulated analog signal s(t) to the amplifier 30. As a result, the amplifier 30 produces an amplified output signal s'(t) subjected to distortion resulting from the nonlinearities. The illustrated modulation system is supplied with a sampled signal 31 of a sampling rate. The sampled signal 31 will presently become clear. The modulation system has a system output terminal 32 through which the modulated analog signal s(t) is supplied to the amplifier 30. The modulation system further has a system input terminal 33 which is supplied with the amplified output signal s'(t) from the amplifier 30.

The modulation system includes a subtracter 34 which produces a difference signal representative of a difference between the sampled signal 31 and an additional digital signal 35 which will later become clear. Connected to the subtracter 34, a processing arrangement 36 processes the sampled signal 31 with reference to the difference signal to compensate for the nonlinearities and to produce a processed signal 37.

Connected to the processing arrangement 36, a modulating arrangement 38 modulates the processed signal 37 into the modulated analog signal s(t). The processing arrangement 36 and the modulating arrangement 38 are later described more in detail.

As will later be described, a quadrature demodulator 39 is connected to the system input terminal 33 to demondulate the amplified output signal s'(t) into a demodulated signal. Connected to the quadrature demodulator 39, an analog-to-digital converter (A/D) 40 converts the demodulated signal into the additional digital signal 35 at a specific rate which is equal to the sampling rate.

The sampled signal 31 is obtained by sampling an original analog signal (not shown) at the sampling rate. The original analog signal preliminarily subjected to band restriction by a smoothing circuit (not shown). The original analog signal may carry, as an information signal, either a pair of parallel digital signals or an analog signal, such as an audio signal, which may be subjected to amplitude modulation so as to appear in a single side band. Such an information signal is divided into an in-phase component a(t) and a quadrature phase component b(t). For example, when single side band transmission is applied to transmit the audio signal, it is well known in the art that the in-phase component a(t) is representative of the audio signal while the quadrature phase component is representative of a signal into which the in-phase component is converted by Hilbert conversion. Anyway, the information signal may be called a baseband signal of a preselected signal band and be given by:

$$a(t) + jb(t). \tag{1}$$

It is mentioned here that the information signal can be reproduced by sampling the original analog signal at a different sampling rate determined by the preselected signal band of the information signal, namely, the baseband signal, in the manner known in the art. The different sampling rate may be regarded as a minimum sampling rate necessary for reproducing the information signal. The different sampling rate is therefore equal to twice the signal band when the audio signal is carried by the original analog signal. On the other hand, the different sampling rate is equal to the symbol rate when the digital signal pair is conveyed by the original analog signal.

For brevity of description, it will be assumed that the original analog signal conveys a pair of parallel digital signals each of which is produced at a symbol rate corresponding to the different sampling rate.

The illustrated modulation system delivers the modulated analog signal s(t) given, with reference to Equation (1), by:

$$s(t) = Re\{(a(t) + jb(t)) \cdot exp(j2\pi f_c t)\}, \tag{2}$$

where $f_c$ represents a carrier frequency. When the modulated analog signal s(t) passes through the amplifier 30 having the nonlinearities, the amplifier 30 produces the amplified output signal s'(t) given by:

$$s'(t) = Re\{F(a(t) + jb(t)) \cdot exp(j2\pi f_c t)\}, \tag{3}$$

where F(a(t)+jb(t)) is a function representative of the nonlinearities shown in FIG. 3.

Such nonlinearities can be removed by the use of a function G(x) satisfying the following equation.

$$F(G(a(t) + jb(t))) = a(t) + jb(t). \tag{4}$$

Under the circumstances, the illustrated modulation system realizes the function G(x) and makes the amplifier 30 produce the amplifier output signal s'(t) having no deformation of the signal points.

In FIG. 6, the original analog signal is sampled at the sampling rate as mentioned above. It is to be noted here that the sampling rate is higher than the symbol rate. For instance, when the sampling rate is equal to or greater than four times the different sampling rate, it is possible to sufficiently reduce a third-order component of distortion. Likewise, it is possible to satisfactorily diminish distortion components up to a fifth-order component of distortion when the sampling rate is equal to or greater than six times the different sampling rate. This applies to a case where the audio signal is carried by the original analog signal.

A sequence of the sampled signals 31 is delivered as an address signal to a random access memory (RAM) 53 which memorizes a plurality of predistorted signals. The predistorted signals are produced in accordance with a conversion table for converting a(t)+jb(t) into G(a(t)+jb(t)). The conversion table is adaptively renewed in the manner which is later described.

The random access memory 53 serves to directly convert (a(t)+jb(t)) into G(a(t)+jb(t)). More particularly, the sampled signal sequence 31 is composed of a sequence of in-phase sampled signals I(1) and a sequence of quadrature phase sampled signals Q(1). The in-phase sampled signal sequence I(1) and the quadrature phase sampled signal sequence Q(1) are representative of the in-phase and the quadrature phase components, respectively.

Inasmuch as the predistorted signals are memorized in the random access memory 53 so as to compensate for the nonlinearities of the amplifier 30, one of the predistorted signals is read out of the random access memory 53 in response to the sampled signal sequence.

The afore-mentioned one predistorted signal may be referred to as a current predistorted signal for convenience of description. In the example being illustrated, the current predistorted signal is composed of an in-phase predistorted signal I(2) and a quadrature phase predistorted signal Q(2) which may be called a current in-phase predistorted signal and a current quadrature predistorted signal, respectively.

Figure 7:
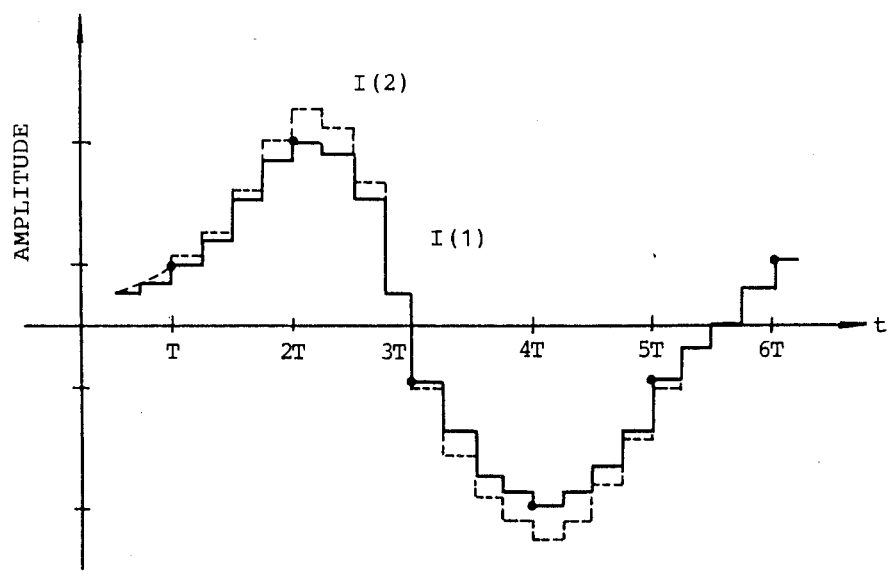
FIG. 7 is a time chart for use in describing operation of the modulation system illustrated in FIG. 6.

Referring to FIG. 7, the in-phase sampled signal sequence I(1) is exemplified by a stepwise solid line while the in-phase predistorted signal sequence I(2) is produced from the random access memory 53 in response to the in-phase sampled signal sequence I(1), as illustrated by a stepwise dashed line. In the example being illustrated in FIG. 7, the in-phase sampled signal sequence conveys the baseband signal which is to be sampled at a period T determined by the symbol rate, as symbolized by dots. The period T may be called a symbol interval. It will readily be understood from FIG. 7 that the in-phase sampled signal sequence I(1) is sampled at the sampling rate which is equal to four times the symbol rate. As a result, the in-phase predistorted signal sequence I(2) appears at the sampling rate. A similar relationship holds between the quadrature phase sampled signal sequence Q(1) and the quadrature phase predistorted signal sequence Q(2).

Referring back to FIG. 6, the in-phase and the quadrature phase predistorted signals I(2) and Q(2) are sent as a sequence of the processed signals 37 to a digital-to-analog converter (D/A) 55 to be converted into a pair of analog signals from which the third-order component of distortion is removed. The analog signal pair is sent to a quadrature modulator 56 to be subjected to quadrature modulation. In order to carry out quadrature-phase modulation, the quadrature modulator 56 is supplied with a carrier signal from an oscillator 57 and delivers the modulated analog signal s(t) through the system output terminal 32 to the amplifier 30. The amplified output signal s'(t) is delivered to an external element (not shown) and is partly fed back through the system input terminal 33 to the quadrature demodulator 39 which is supplied with the carrier signal from the oscillator 57.

Supplied with the carrier signal from the oscillator 57, the quadrature demodulator 39 demodulates the amplified output signal s'(t) into the demodulated signal corresponding to the original analog signal. The demodulated signal is composed of an in-phase demodulated component I(3) and a quadrature phase demodulated signal Q(3) in the illustrated modulation system and is sent to the analog-to-digital converter 40. Anyway, the demodulated signal is representative of a baseband signal similar to that conveyed by the original analog signal.

The analog-to-digital converter 40 converts the in-phase demodulated signal I(3) and the quadrature phase demodulated signal Q(3) into an in-phase demodulated digital signal I(4) and the quadrature phase demodulated digital signal Q(4) at a specific rate which is equal to the sampling rate. Both the in-phase and the quadrature phase demodulated digital signals I(4) and Q(4) are delivered to the subtracter 34 as the additional digital signal 35. From this fact, it is seen that the additional digital signal 35 is sent to the subtracter 34 at the specific rate which is equal to four times the different sampling rate.

It is to be noted here that the illustrated subtracter 34 is supplied with the sampled signals 31 in addition to the additional digital signal 35. More particularly, the subtracter 34 subtracts the in-phase and the quadrature phase demodulated digital signals I(4) and Q(4) from the in-phase and the quadrature phase sampled signals I(1) and Q(1), respectively. The subtracter 34 thereby produces first and second result signals representative of results of subtraction between the in-phase sampled signal I(1) and the in-phase demodulated digital signal I(4) and between the quadrature phase sampled signal Q(1) and the quadrature phase demodulated digital signal Q(4), respectively.

If the random access memory 53 normally converts the in-phase and the quadrature phase sampled signals I(1) and Q(1) into the in-phase and the quadrature phase predistorted signals I(2) and Q(2), each of the first and the second result signals becomes equal to zero.

If each of the first and the second result signals is not equal to zero, a modification amount calculator 64 multiplies the first and the second result signals by a factor p which is smaller than unity. The modification amount calculator 64 thereby produces calculator output signals representative of the modification amount. The calculator output signals are added in an adder 66 to the in-phase and the quadrature phase predistorted signals I(2) and Q(2) to be sent to the random access memory 53 as first and second write-in signals I(5) and Q(5), respectively. The first and the second write-in signals I(5) and Q(5) are produced by modifying the current predistorted signals and may be named modified signals. As a result, the current in-phase and the current quadrature phase predistorted signals I(2) and Q(2) are rewritten into the respective write-in signals I(5) and Q(5).

In the subtracter 34, the in-phase and the quadrature phase sampled signals I(1) and Q(1) may be subtracted from the in-phase and the quadrature phase demodulated digital signals I(4) and Q(4), respectively, instead of subtraction of the demodulated digital signals I(4) and Q(4) from the sampled signals I(1) and Q(1). In this event, a subtracter should be substituted for the adder 66 to calculate a difference between the calculator output signals and the predistorted signals I(2) and Q(2).

On manufacture of the demodulation system, initial predistorted signals are preliminarily memorized as preliminarily memorized signals in the random access memory 53 so as to accurately compensate for the non-linearities. In this event, the in-phase sampled signal sequence I(1) and the quadrature phase sampled signal sequence Q(1) become equal to the in-phase demodulated signal sequence I(4) and the quadrature phase demodulated signal sequence Q(4), respectively. That is, the sampled signal 31 becomes equal to the additional digital signal 35. As a result, the subtracter 34 produces the difference signal representative of the difference which is equal to zero.

However, a delay characteristic is unavoidably varied in the amplifier 30 in an actual usage as mentioned in the preamble of the instant specification. For example, a delay characteristic of the amplifier 30 varies in accordance with an ambient temperature of the amplifier 30.

Figure 8:
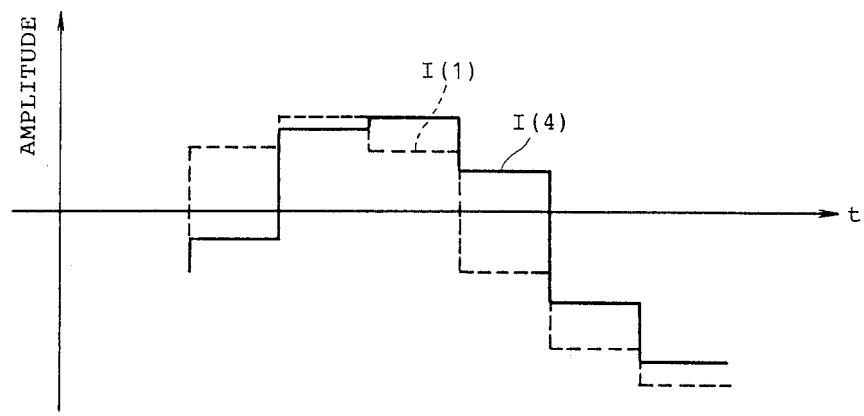
FIG. 8 is another time chart for use in describing operation of the modulation system illustrated in FIG. 6.

Supposing that a change of the delay characteristic is represented by $\tau$, the in-phase demodulated digital signal I(4) and the quadrature phase demodulated digital signal Q(4) are represented by a $(t+\tau)$ and b$(t+\tau)$, respectively. On the other hand, the in-phase sampled signal I(1) and the quadrature sampled signal Q(1) are represented by a(t) and b(t), respectively. A relationship between the in-phase sampled signal I(1) and the in-phase demodulated digital signal I(4) is illustrated in FIG. 8. In this event, the subtracter 34 produces the difference signal representative of the difference which is not equal to zero. As a result, the random access memory 53 is undesiredly updated. This gives rise to degradation of the transmission spectrum of the amplified output signal s'(t). Thus, it is impossible to accurately compensate for the nonlinearities.

When the preliminarily memorized signals are erased from the random access memory 53, it is also impossible to accurately compensate for the nonlinearities.

Figure 9:
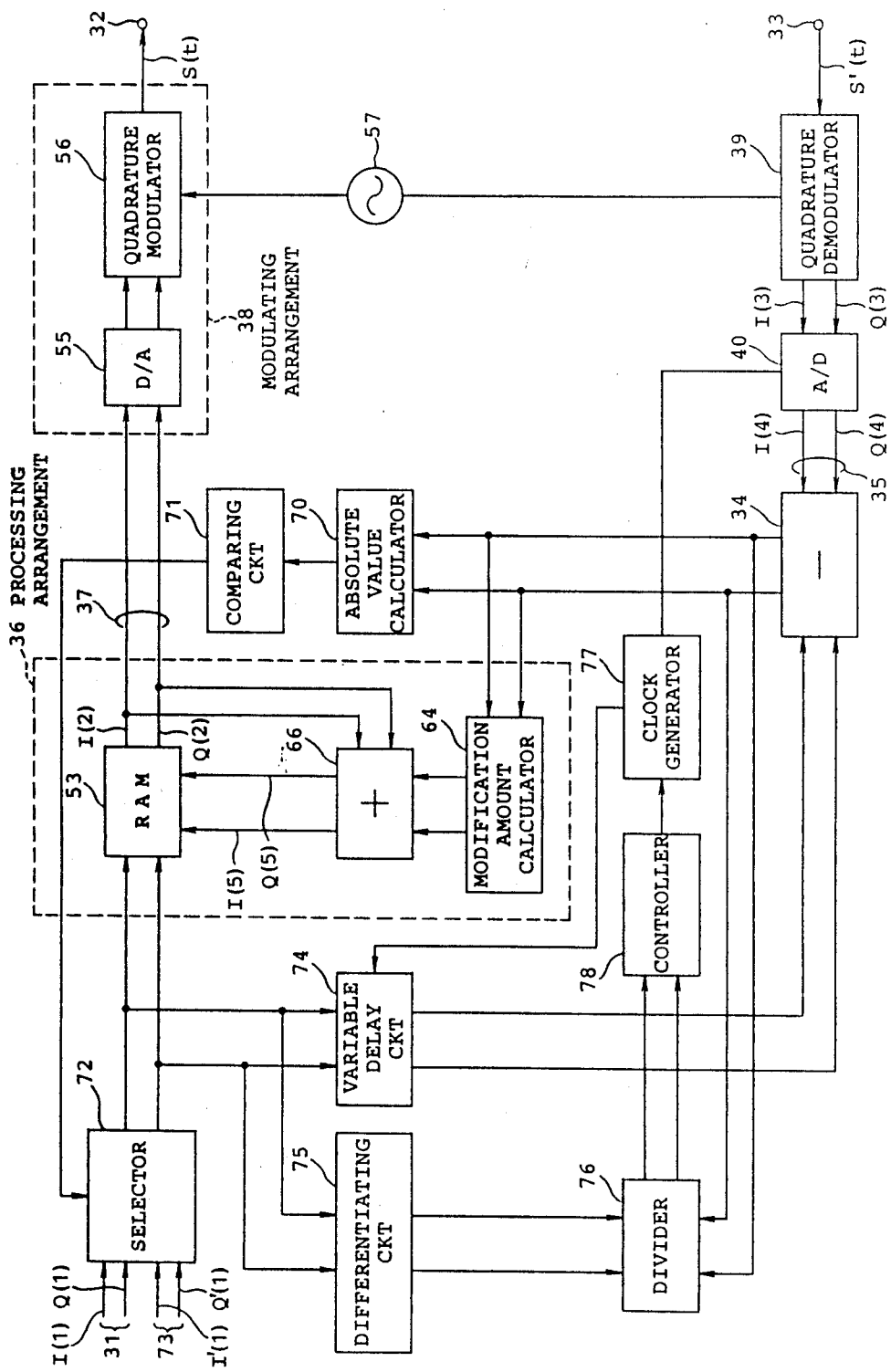
FIG. 9 is a block diagram of a modulation system according to an embodiment of this invention.

Referring now to FIG. 9, a modulation system according to a preferred embodiment of this invention is similar to the modulation system of FIG. 6 except for the following. Merely for convenience of description, the sampled signal 31 and the sampling rate will be called a first sampled signal and a first sampling rate, respectively.

An absolute value calculator 70 is connected to the subtracter 34 and produces an absolute value signal representative of an absolute value of the difference signal. Connected to the absolute value calculator 70, a comparing circuit or comparator 71 compares the absolute value with a preselected threshold value to produce a first control signal when the absolute value is less than the threshold value and to produce a second control signal when the absolute value is not less than the threshold value.

A selector 72 is supplied with the first sampled signal 31 and is connected to the comparing circuit 71 and the processing arrangement 36. Supplied with a second sampled signal 73 of a second sampling rate, the selector 72 selects the first and the second sampled signals as a selected signal to use the first and the second sampling rates as the specific rate when supplied with the first and the second control signals, respectively. The second sampling rate is equal to 1/N of the first sampling rate, where N represents an integer greater than one.

The subtracter 34 is supplied with the selected signal through a variable delay circuit 74 which will later be described. The selected signal is substituted for the first sampled signal 31 and processed and modulated into the modulated analog signal s(t) so long as the comparing circuit 71 produces the second control signal. The second sampled signal 73 is composed of an in-phase sampled signal I'(1) and a quadrature phase sampled signal Q'(1) like the first sampled signal 31.

Even when the selector 72 selects the second sampled signal 73 as the selected signal, the amplifier 30 (FIG. 6) may give a delay to the modulated analog signal s(t). However, the delay is negligible because the delay is extremely small relative to a reciprocal of a sampling frequency determined by the second sampling rate. This is because the reciprocal of the second frequency is equal to N times another reciprocal of another sampling frequency determined by the first sampling rate.

In practice, the selector 72 selects the second sampled signal 73 when the modulation system is activated by putting a power source switch (not shown) thereof into an ON state and when the absolute value of the difference is greater than the threshold value. When the absolute value becomes less than the threshold value, the selector 72 selects the first sampled signal 31. Such selecting operation of the selector 72 is controlled by the first and the second control signals which are produced by the comparing circuit 71. Thus, it is possible to compensate for the delay which inevitably occurs in the amplifier 30. As a result, it is possible to accurately compensate for the nonlinearities.

The modulation system further comprises a differentiating circuit 75 connected to the selector 72 to produce a differential signal representative of a differential of the selected signal. Connected to the subtracter 34 and the differentiating circuit 74, a divider 76 produces a quotient signal representative of a quotient of the difference signal by the differential signal.

A clock generator 77 is connected to the analog-to-digital converter 40 and generates a sampling signal having a phase and a clock frequency. The sampling signal is supplied to the analog-to-digital converter 40 to decide the specific rate. The clock generator 77 also generates a delay control signal. Responsive to the delay control signal, the variable delay circuit 74 delays the selected signal by a variable delay which is varied in accordance with the delay control signal.

A controller 78 is connected to the divider 76 and the clock generator 77 to control the phase of the sampling signal so that the quotient becomes equal to zero.

Supposing that the predistorted signals are correctly memorized or kept in the random access memory 53, the selected signal is identical with the additional digital signal 35. Further supposing that a time difference $\tau$ is generated between the selected signal 31 or 73 and the additional digital signal 35, the subtracter 34 produces the difference signal representative of the difference which is denoted by $\Delta S(t)$ and represented by:

$$\Delta S(t) = S(t) - S(t-\tau), \tag{5}$$

where S(t) represents the selected signal and S(t−τ) represents the additional digital signal 35. Presuming that the time difference $\tau$ is equal to an extremely short time duration $\Delta t$, the differentiating circuit 75 produces the differential signal representative of a differential which is represented by:

$$S'(t) = \lim_{\Delta t \to \infty} [(S(t) - S(t - \Delta t))/\Delta t]. \tag{6}$$

From Equation (6), the difference $\Delta S(t)$ is approximately given by:

$$\Delta S(t) = \tau S'(t). \tag{7}$$

By preliminarily obtaining the differential value S'(t) from the selected signal S(t) used as a reference, the time difference $\tau$ is obtained by calculating Equation (8) represented by:

$$\hat{\tau} = \Delta S(t)/S'(t). \tag{8}$$

In the modulation system illustrated in FIG. 9, the time difference $\tau$ is calculated in the following manner.

It will be assumed that the subtracter 34 produces in-phase and quadrature phase difference signals denoted by DI(t) and DQ(t), respectively, and that the subtracter 34 receives from the variable delay circuit 74 in-phase and quadrature selected signals which are denoted by SI(t) and SQ(t), respectively. The in-phase and the quadrature phase difference signal DI(t) and DQ(t) are approximately represented by:

$$DI(t) = \tau(dSI(t)/dt), \quad DQ(t) = \tau(dSQ(t)/dt).$$

The differentiating circuit 75 produces the differential signal representative of the differentials represented by:

$T(dSI(t)/dt)$, $T(dSQ(t)/dt)$, where T represents a sampling period of each of the in-phase and the quadrature phase selected signals SI(t) and SQ(t). The differential can be obtained by calculating a difference between two of successive samples of each of the first and the second sampled signals 31 and 73.

The divider 76 divides the difference signal DI(t) by the differential signal $T(dSI(t)/dt)$ and produces the quotient signal representative of the quotient represented by $\tau/T$. The divider 76 divides the difference signal DQ(t) by the differential signal $T(dSQ(t)/dt)$ and also produces the quotient signal representative of the quotient represented by $\tau/T$.

As described above, the controller 78 controls the phase of the sampling signal so that the quotient becomes equal to zero.

More specifically, the controller 78 shifts the phase of the sampling signal forwardly along a time axis when the divider 76 produces the quotient signal representative of the quotient which has a positive value. When the divider 76 produces the quotient signal representative of the quotient which has a negative value, the controller 78 shifts the phase of the sampling signal backwardly along the time axis.

When an absolute value of the quotient is greater than one, the controller 78 supplies the delay control signal to the variable delay circuit 74 so as to give the selected signal a delay which is equal to a sampling period of the selected signal. This makes it easily possible to control the phase of the sampling signal so that the differential becomes equal to zero.

However, it should be understood that the variable delay circuit 74 is not always necessary in the modulation system illustrated in FIG. 9. That is, the selected signal may be directly supplied to the subtracter 34.

What is claimed is:

1. A modulation system for processing and modulating a first sampled signal of a first sampling rate to supply a modulated analog signal to an amplifier having nonlinearities to make said amplifier produce an amplified output signal, said modulation system including: subtracting means for producing a difference signal representative of a difference between said first sampled signal and an additional digital signal; processing means connected to said subtracting means for processing said first sampled signal with reference to said difference signal to compensate for said nonlinearities to produce a processed signal; modulating means connected to said processing means for modulating said processed signal into said modulated analog signal; demodulating means connected to said amplifier for demodulating said amplified output signal into a demodulated signal; and converting means connected to said demodulating means for converting said demodulated signal into said additional digital signal at a specific rate; wherein the improvement comprises:
    absolute value calculating means connected to said subtracting means for producing an absolute value of said difference signal;
    comparing means connected to said absolute value calculating means for comparing said absolute value with a preselected threshold value to produce a first control signal when said absolute value is less than said threshold value and to produce a second control signal when said absolute value is not less than said threshold value; and
    selecting means connected to said comparing means and said processing means and supplied with a second sampled signal of a second sampling rate for selecting said first and said second sampled signals as a selected signal to use said first and said second sampling rates as said specific rate when supplied with said first and said second control signals, respectively, said second sampling rate being equal to 1/N of said first sampling rate, where N represents an integer greater than one, said selected signal being substituted for said first sampled signal and processed and modulated into said modulated analog signal so long as said comparing means produces said second control signal.

2. A modulation system as claimed in claim 1, wherein said modulation system comprises:
    differentiating means connected to said selecting means for producing a differential signal representative of a differential of said selected signal;
    dividing means connected to said subtracting means and said differentiating means for producing a quotient signal representative of a quotient of said difference signal by said differential signal;
    clock generating means connected to said converting means for generating a sampling signal having a phase and a clock frequency, said sampling signal being supplied to said converting means to decide said specific rate; and
    controlling means connected to said dividing means and said clock generating means for controlling the phase of said sampling signal so that said quotient becomes equal to zero.

3. A modulation system for processing and modulating a sampled signal of a sampling rate to supply a modulated analog signal to an amplifier having nonlinearities to make said amplifier produce an amplified output signal, said modulation system including: subtracting means for producing a difference signal representative of a difference between said sampled signal and an additional digital signal; processing means connected to said subtracting means for processing said sampled signal with reference to said difference signal to compensate for said nonlinearities to produce a processed signal; modulating means connected to said processing means for modulating said processed signal into said modulated analog signal; demodulating means connected to said amplifier for demodulating said amplified output signal into a demodulated signal; clock generating means for generating a sampling signal having a phase and a clock frequency determined by a specific rate which is equal to said sampling rate; and converting means connected to said demodulating means and said clock generating means for converting said demodulated signal into said additional digital signal at said specific rate; wherein the improvement comprises:
    differentiating means for producing a differential signal representative of a differential of said sampled signal;
    dividing means connected to said subtracting means and said differentiating means for producing a quotient signal representative of a quotient of said difference signal by said differential signal; and
    controlling means connected to said dividing means and said clock generating means for controlling the phase of said sampling signal so that said quotient becomes equal to zero.

* * * * *